US008692646B2

(12) United States Patent
Lee et al.

(10) Patent No.: US 8,692,646 B2
(45) Date of Patent: Apr. 8, 2014

(54) PIEZORESISTIVE TYPE TOUCH PANEL; MANUFACTURING METHOD THEREOF; AND DISPLAY DEVICE, TOUCH PAD, PRESSURE SENSOR, TOUCH SENSOR, GAME CONSOLE AND KEYBOARD HAVING THE PANEL

(76) Inventors: Kang Won Lee, Daejeon (KR); Seung Seob Lee, Daejeon (KR); Jung A. Lee, Daejeon (KR); Kwang Cheol Lee, Daejeon (KR)

(*) Notice: Subject to any disclaimer, the term of this patent is extended or adjusted under 35 U.S.C. 154(b) by 375 days.

(21) Appl. No.: 13/080,024

(22) Filed: Apr. 5, 2011

(65) Prior Publication Data

US 2012/0256838 A1 Oct. 11, 2012

(51) Int. Cl.
| H01C 10/10 | (2006.01) |
| H01C 17/00 | (2006.01) |
| H01C 10/12 | (2006.01) |
| H01H 65/00 | (2006.01) |
| H03K 17/96 | (2006.01) |
| G06F 3/041 | (2006.01) |

(52) U.S. Cl.
CPC .............. H01C 17/00 (2013.01); H01C 10/12 (2013.01); H01C 10/10 (2013.01); H01H 65/00 (2013.01); H03K 17/9643 (2013.01); G06F 3/0414 (2013.01)
USPC ............................................ 338/47; 345/174

(58) Field of Classification Search
CPC ...... H01C 17/00; H01C 10/10; H01C 10/106; H01C 10/12; H01H 65/00; H03K 17/9643; G06F 3/0414
USPC ...................................... 338/47; 345/173, 174
See application file for complete search history.

(56) References Cited

U.S. PATENT DOCUMENTS

| 8,237,680 B2 * | 8/2012 | Jiang et al. .................... 345/173 |
| 2010/0001972 A1 * | 1/2010 | Jiang et al. .................... 345/173 |
| 2010/0108409 A1 * | 5/2010 | Tanaka et al. ............... 178/18.06 |
| 2010/0149076 A1 * | 6/2010 | Yoo ................................ 345/60 |

OTHER PUBLICATIONS

Applied Physics Letters 88, 123109 (2006), Zhou et al., Mar. 22, 2006.*

* cited by examiner

*Primary Examiner* — Kyung Lee
(74) *Attorney, Agent, or Firm* — Harness, Dickey & Pierce, PLC

(57) ABSTRACT

The present invention relates to a touch panel, more specifically a piezoresistive type touch panel. According to the present invention, it is provided a manufacturing method of a piezoresistive type touch panel, comprising manufacturing a polymer membrane in which a piezoresistive type film pattern, of which resistance varies with applied pressure, is embedded; manufacturing a spacer layer and attaching one side of the spacer layer to a surface of the polymer membrane; and then attaching a bottom substrate to the other side of the spacer layer.

10 Claims, 20 Drawing Sheets

Fig. 2A
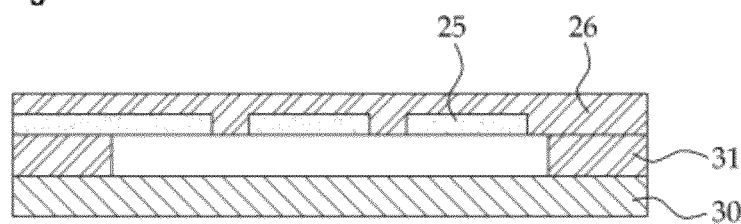
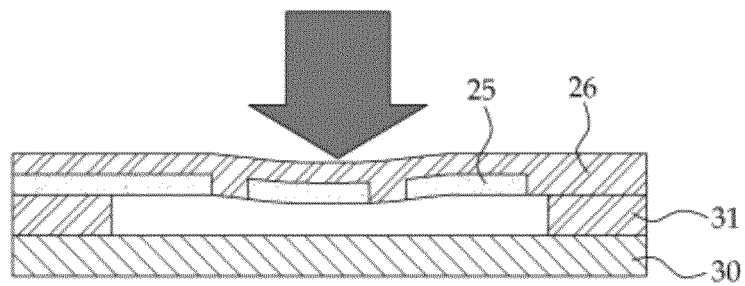
Fig. 2B

Fig. 3A
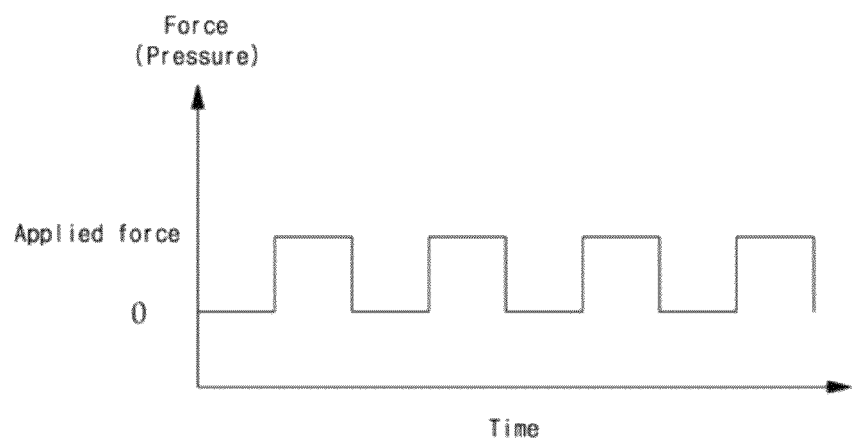
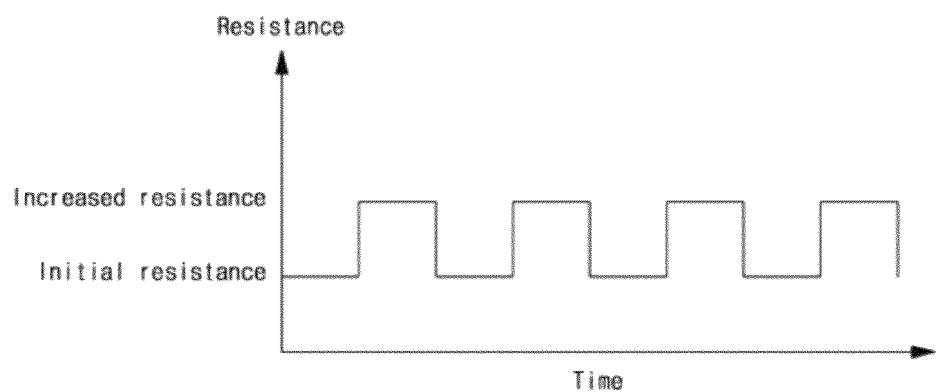
Fig. 3B

Fig. 4A
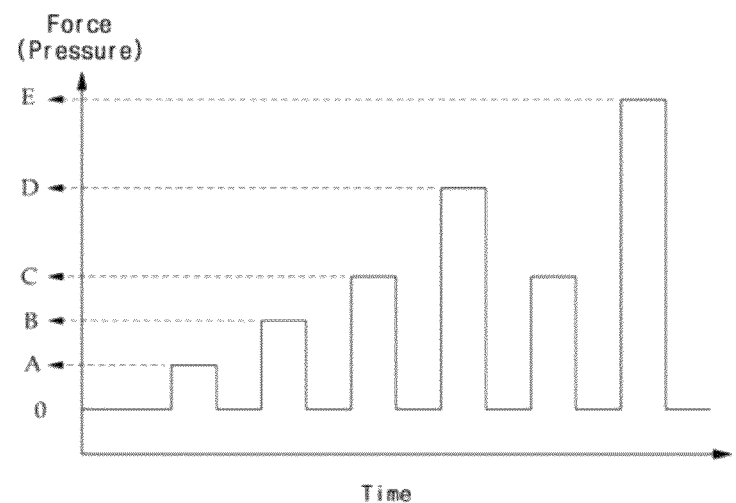
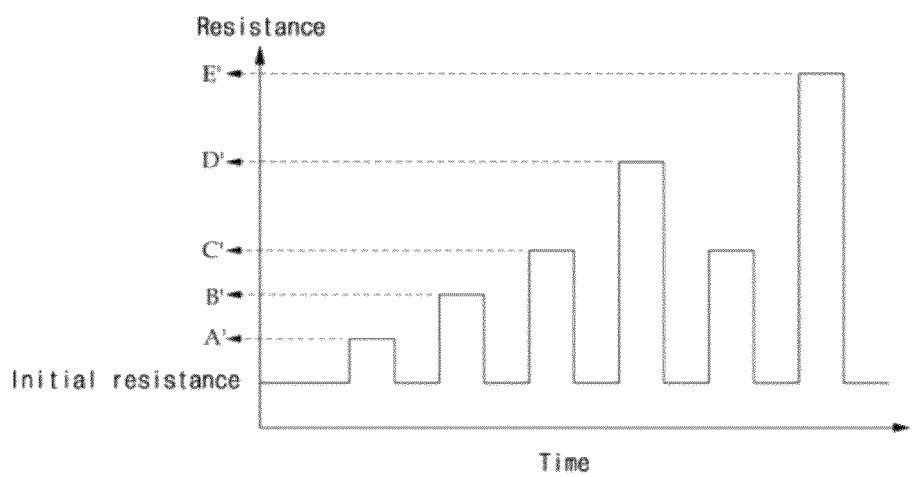
Fig. 4B

Fig. 4C
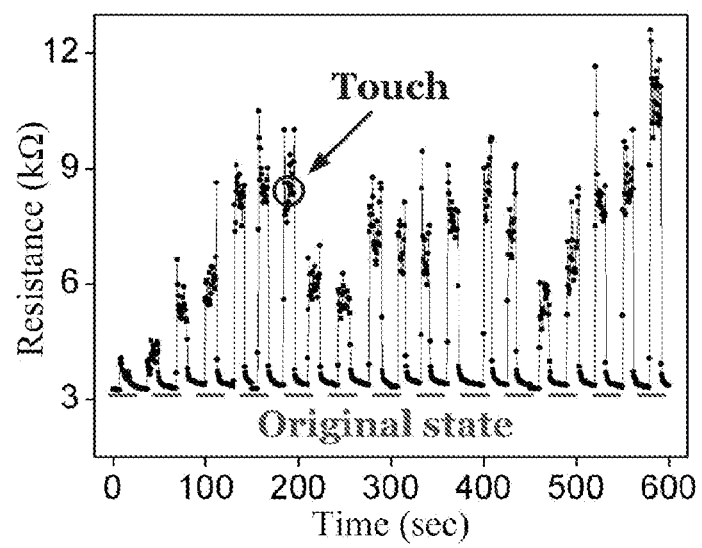
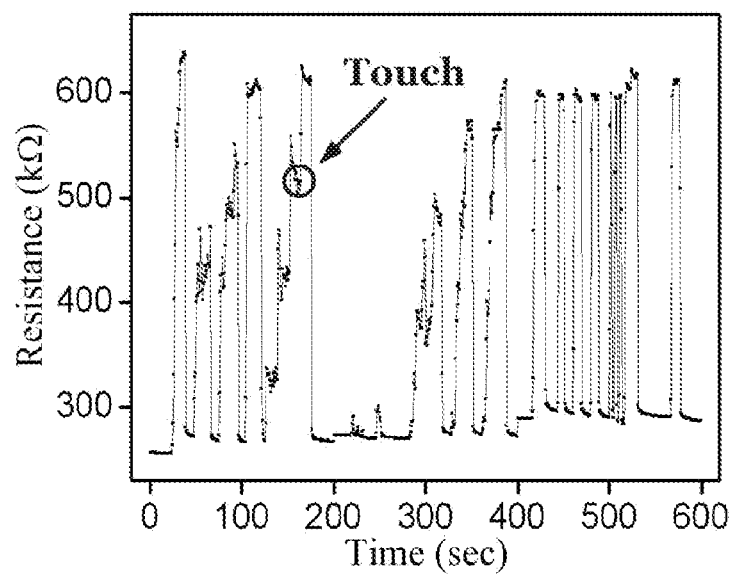
Fig. 4D

Fig. 22A
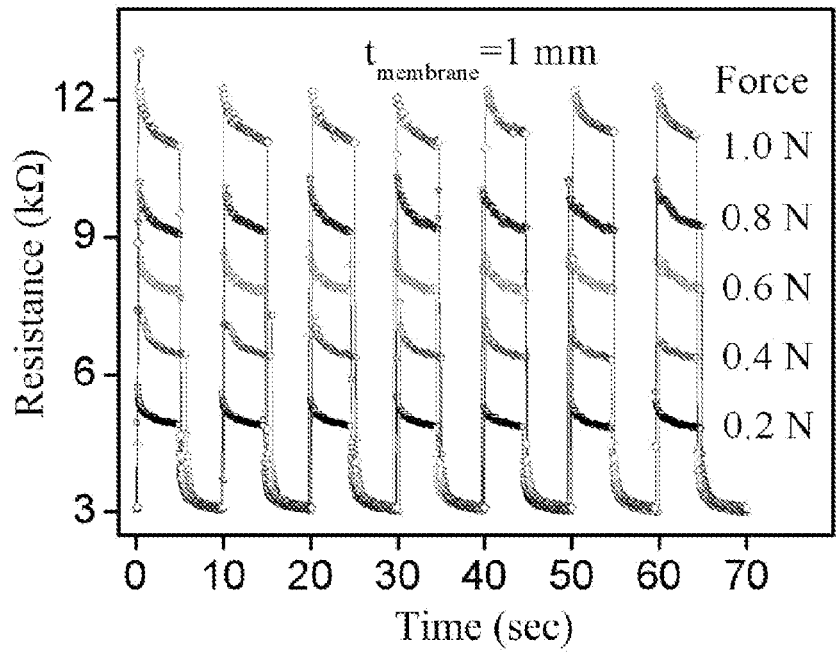
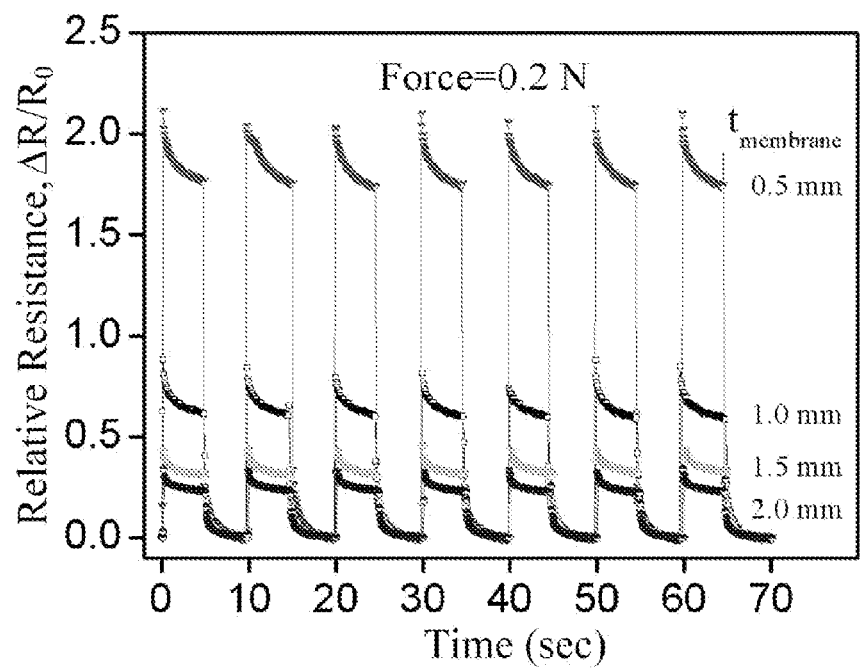
Fig. 22B

PIEZORESISTIVE TYPE TOUCH PANEL; MANUFACTURING METHOD THEREOF; AND DISPLAY DEVICE, TOUCH PAD, PRESSURE SENSOR, TOUCH SENSOR, GAME CONSOLE AND KEYBOARD HAVING THE PANEL

FIELD

The present disclosure relates to a touch panel, more specifically a piezoresistive type touch panel.

BACKGROUND

Touch panel is a device for signal input for electronic devices such as computer, personal portable terminal, and all sorts of business machines, using signal transmission by contact of a finger or a pen, without using an input device such as keyboard or mouse. In general, the touch panel is classified according to realization method into resistive type and capacitive type. The resistive type uses two substrates, on each of which transparent electrode is coated, and when upper and lower electrodes become to contact with each other upon application of pressure by a finger or a pen, an electric signal is generated and the contact point can be recognized. The capacitive type is activated by sensing electricity generated from human body and is very durable.

SUMMARY

Problems to be Solved

The prior touch panel mentioned above has following problems. The resistive type is cheap and very accurate, but has a disadvantage that there is a high risk of failure due to physical contact of two electrode layers. The capacitive type has a disadvantage that it is not activated by a pen or a finger of hand wearing gloves which does not generate electricity.

The present invention is to solve the mentioned problems and to provide piezoresistive type touch panel which is very durable and is able to use any type of input means.

Means for Solving the Problems

According to the present invention, it is provided a manufacturing method of a piezoresistive type touch panel, comprising manufacturing a polymer membrane in which a piezoresistive type film pattern, of which resistance varies with applied pressure, is embedded; manufacturing a spacer layer and attaching one side of the spacer layer to a surface of the polymer membrane; and then attaching a bottom substrate to the other side of the spacer layer.

The step of manufacturing a polymer membrane may be a process of manufacturing a polymer membrane including carbon nanotube film pattern.

Further, the step of manufacturing a polymer membrane may comprise (a) forming a intermediate layer on a substrate; (b) forming a carbon nanotube film layer on the intermediate layer; (c) patterning the carbon nanotube film layer to form a carbon nanotube film pattern on the intermediate layer; (d) applying a polymer solution over the intermediate layer on which the carbon nanotube film pattern is formed, and curing the applied polymer solution to form a polymer membrane including the carbon nanotube film pattern; and (e) separating the polymer membrane including the carbon nanotube film pattern from the intermediate layer.

Further, the step of manufacturing a spacer layer and attaching one side of the spacer layer to a surface of the polymer membrane may comprise (f) forming a mold on a base; (g) applying a polymer solution over the base on which the mold is formed, and curing the applied polymer solution to form a spacer layer; (h) separating the spacer layer from the mold and the base; and (i) attaching the separated spacer layer to the polymer membrane having the carbon nanotube film pattern.

According to another aspect of the present invention, it is provided a piezoresistive type touch panel comprising a polymer membrane in which a piezoresistive type film pattern, of which resistance varies with applied pressure, is embedded; a bottom substrate opposite the polymer membrane; and a spacer layer disposed between the polymer membrane and the bottom substrate for providing gaps between them.

The piezoresistive film pattern may be a carbon nanotube film pattern.

According to another aspect of the present invention, it is provided input devices for all sorts of electronic devices such as display, touch pad, and pressure sensor.

Advantages

The piezoresistive type touch panel according to the present invention has advantages as follows:

First, it is very durable since it uses a piezoresistive mechanism, and can use any type of input devices.

Second, the resistance of the touch panel varies with the applied pressure to the piezoresistive film, and thus it can be applied to multi-functional touch sensor.

Third, unlike prior touch panel, all of main elements of polymer membrane and piezoresistive film pattern are flexible. Thus, it can be applied, for example, to flexible or bendable display and touch pad, etc.

DRAWINGS

FIGS. 2A and 2B are cross-sectional views of a portion of the touch panel illustrated in FIG. 1.

FIGS. 3A to 4D, are graphs showing the property of the carbon nanotube film pattern as a piezoresistor.

FIGS. 22A and 22B illustrate experimental results of (a) change of resistance of SWCNF piezoresistors with time at different forces for PDMS membrane with the thickness of 1 mm; and (b) change of relative resistance of SWCNF piezoresistors with time at different thickness when a force of 0.2N is applied.

DETAILED DESCRIPTION

Figure 1:
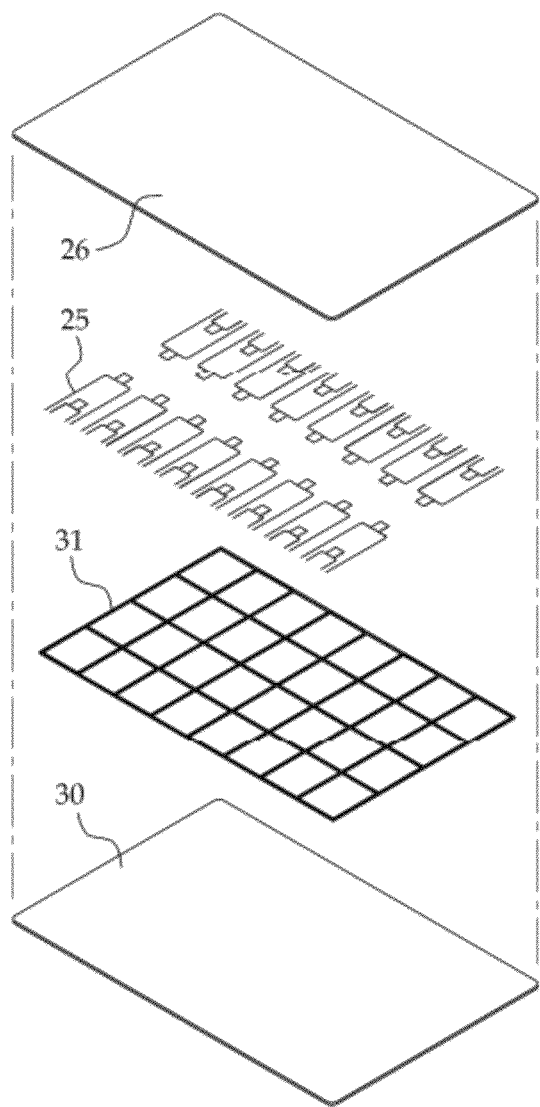
FIG. 1 is an exploded perspective view of a piezoresistive type touch panel according to an embodiment of the present invention.

With reference to drawings attached, a piezoresistive type touch panel according to an embodiment of the present invention and manufacturing method thereof are explained hereinafter. The size and shape etc. in the drawings may be exaggerated or simplified for ease of understanding of the invention.

FIG. 1 is an exploded perspective view of a piezoresistive type touch panel according to an embodiment of the present invention, and FIGS. 2A and B are cross-sectional views of a portion of the touch panel illustrated in FIG. 1.

As shown in FIG. 1 and FIGS. 2A and 2B, the touch panel according to an embodiment of the present invention comprises a polymer membrane (26), a carbon nanotube film (CNF) pattern (25) embedded in the polymer membrane (26), a spacer (31) and a bottom substrate (30). In this embodiment, the polymer membrane (26) in which the carbon nanotube film pattern (25) is embedded constitutes an upper layer.

With the application of pressure, the polymer membrane (26) deflects and the carbon nanotube film pattern (25) embedded in the polymer membrane (26) also deflects accordingly, which results in change of resistance of the carbon nanotube film pattern (25). Thus, this change of resistance makes possible to detect the pressure. When used in a touch pad, it does not need transparent polymer membrane, but when used in a display such as touch screen, a transparent and flexible membrane is used. For transparent and flexible material, for example, there are PDMS (poly-dimethylsiloxane), PET (polyethylene terephthalate), and polyimide, etc.

The carbon nanotube film pattern (25) is formed by patterning the carbon nanotube film layer in a predetermined shape. The touch panel according to the present invention uses change of resistance of the carbon nanotube film pattern (25), and thus it has advantages that it is very sensitive and can be attached to a curved surface. As well known, carbon nanotubes are allotropes of carbon with cylindrical nanostructure where one carbon atom is bonded with other carbon atoms like hexagonal honeycomb structure. The diameter of carbon nanotube is very minute on the order of a few nanometers, its conductivity is about 1000 times than copper (Cu), and its strength is 100 times than steel. Further, carbon nanotube has a property that it can undergo deformation of 15% without fracture. Due to this property, carbon nanotube is adapted to flexible electric element which can be embedded in a polymer membrane (26) and deformed together with the polymer membrane (26). The carbon nanotube film pattern (25) is embedded in the polymer membrane (26) such that a surface of the pattern is exposed as a surface of the polymer membrane (26). Therefore, the bonding force between the carbon nanotube film pattern (25) and the polymer membrane (26) is very strong, and thus the carbon nanotube film pattern (25) is not easily separated from the polymer membrane (26).

The carbon nanotube film pattern (25) serves as a piezoresistor. Piezoresistor has a property that resistance as an electric signal changes with mechanical deformation, where gauge factor, G, representing strain sensitivity of piezoresistor is an important factor. As piezoresistor used in the field of micro electromechanical systems (MEMS), there are single crystal silicon and metal. The single crystal silicon is made from impurity doping process in a hot atmosphere over 1000° C., and has high gauge factor of 100 to 170. However, due to manufacturing process in a hot atmosphere, the single crystal silicon cannot be used with polymer substrate. Metal is deposited by vacuum metallization, and has low gauge factor of 2 to 5. This can be used with polymer substrate, but, due to the low sensitivity, the application field is very limited. The carbon nanotube film pattern (25) used in the present invention has a maximum of 10 times of gauge factor than metal used with polymer substrate, and can be formed at low temperature, which makes it possible to be used as transparent electrode in touch panel.

FIGS. 3A and 3B and FIGS. 4A-4D are graphs showing the property of the carbon nanotube film pattern as a piezoresistor. FIGS. 3A and 3B show the resistance of the carbon nanotube film pattern which increases and falls to the original value repeatedly as the same force or pressure is applied and removed repeatedly. FIGS. 4A and 4B show that the resistance of the carbon nanotube film pattern increases in proportion of the values of the applied forces or pressures varying the values thereof. Even at the same position, the value of the resistance varies according to the value of the applied force or pressure, and thus it can be applied to multi-functional touch sensor which can perform multi functions with one button. FIGS. 4C and 4D show experimental results that resistance changes by physical touch when using SWCNF (Single-Walled Carbon Nanotube Film) piezoresistors and MWCNF (Multi-Walled Carbon Nanotube Film) piezoresistors. The initial resistance of SWCNF piezoresistors is 3 kΩ and the initial resistance of MWCNF piezoresistors is 280 kΩ. The electrical property of MWCNTs was low, that is the resistance value of MWCNF piezoresistors is high compared to SWCNTs. These results show that the resistance increases during a physical touch and returns to the original resistance value when the touch is removed; and also indicate that the resistance is changed in proportion to the applied force of the touch.

The spacer (31) serves to secure a space between the carbon nanotube film pattern (24) and the bottom substrate (30) so that the carbon nanotube film pattern (25) deforms to vary the value of the resistance of the film pattern.

The bottom substrate supports the spacer (31). When applied to a touch screen, transparent glass or plastic substrate is used and a LCD layer as an illuminator is located below the bottom substrate.

Hereinafter, the operation principle of the touch panel using piezoresistive mechanism is briefly explained. The carbon nanotube film pattern (25) serving as a transparent electrode is embedded in a polymer membrane (26), and deflects when a surface of the polymer membrane (26) is pushed with a pen or a finger. The piezoresistive material has a property that resistance varies according to mechanical deformation. Thus, by measuring the change of resistance with the location of a touch panel, the location at which pressure is applied can be recognized.

Hereinafter, a manufacturing method of a piezoresistive type touch panel according to an embodiment of the present invention is explained.

Figure 5:
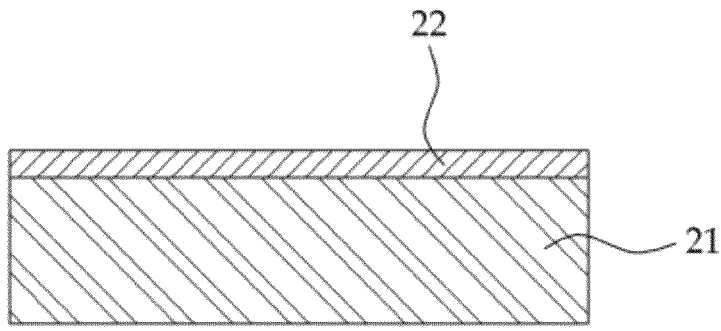
FIG. 5 illustrates a state in which an intermediate layer is formed on a substrate, in the process of manufacturing of a piezoresistive type touch panel according to an embodiment of the present invention.

First, as shown in FIG. 5, after cleaning a substrate (21), an intermediate layer (22) is formed. As the substrate (21), hard material such as silicon, glass, quartz etc. can be used. The intermediate layer (25) is to be removed after the polymer membrane (26) is formed, and thus it is preferable that bonding force between the intermediate layer (25) and the substrate (21) is weak. Also, it is preferable that the bonding force between the intermediate layer (22) and the substrate (21) is weaker than that between the intermediate layer (22) and the polymer membrane (26); that the intermediate layer (22) is not damaged when forming the polymer membrane (26); and that, after forming the polymer membrane (26), the intermediate layer (22) can be selectively removed with ease without not damaging the polymer membrane (26).

As an intermediate layer (22) satisfying such conditions, thin film of various material may be used. For example, a thin film of metal such as gold (Au) may be used as the intermediate layer (22). The meal thin film has weak bonding force with the substrate (21), is not damaged during the process of growth of carbon nanotube and polymer material and the process of etching, and can be removed by etching solution without damaging the polymer. The metal thin film may be deposited on the substrate (21) by E-beam evaporation or sputtering.

After forming the intermediate layer (22) on the substrate (21), carbon nano film layer (24) is formed over the intermediate layer (22). To form the carbon nanotube film layer (24), spin coating method or vacuum filtration method may be used.

Figure 6:
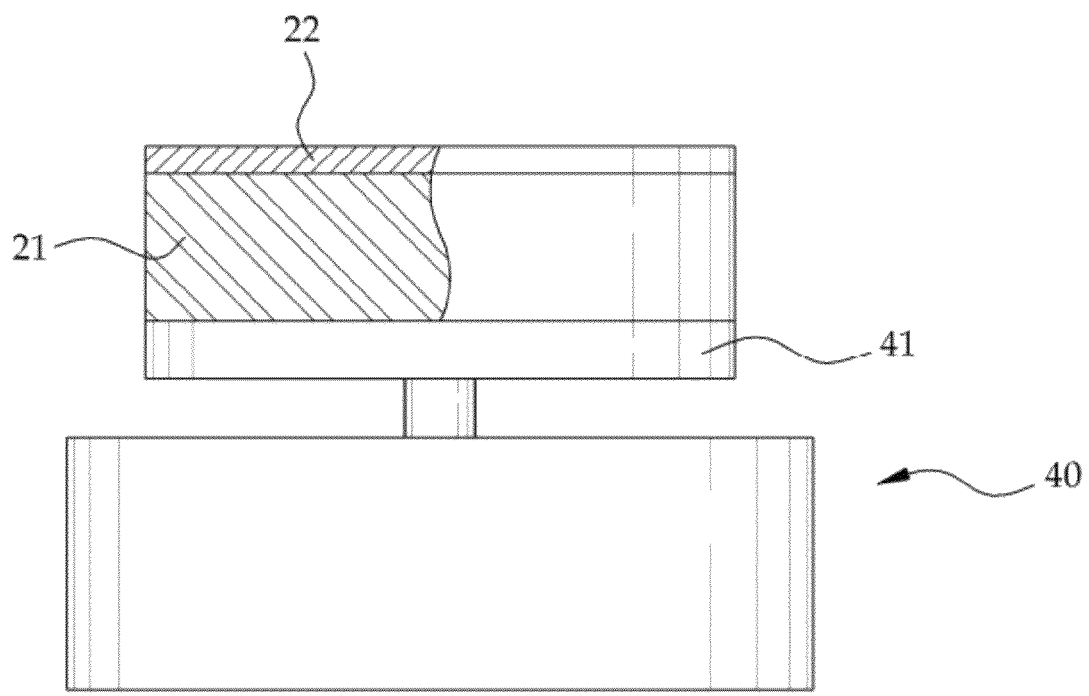
FIG. 6 and FIG. 7 illustrate the process to form the carbon nanotube film layer by a spin coating method, in the process of manufacturing of a piezoresistive type touch panel according to an embodiment of the present invention.
Figure 7:
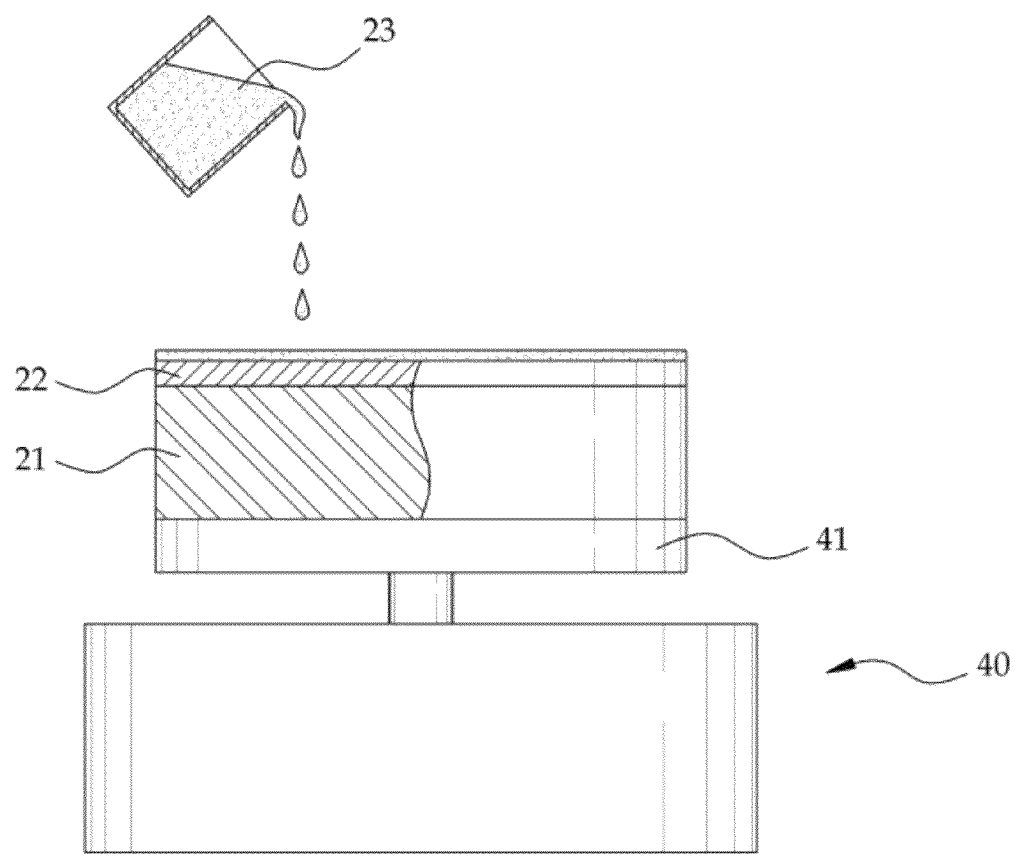

FIG. 6 and FIG. 7 illustrate the process to form the carbon nanotube film layer (24) by the spin coating method using spin coater (40). First, as shown in FIG. 6, the substrate (21) on which the intermediate layer (22) is formed is mounted on a turn table (41) of the spin coater (40). Then, as shown in FIG. 7, as the turn table (41) is rotated, carbon nanotube solution (23) is dropped over the rotating intermediate layer (22). Here, the carbon nanotube solution (23) is applied on a surface of the intermediate layer (22) at a constant thickness. After that, the carbon nanotube solution (23) applied over the intermediate layer (22) is dried to form carbon nanotube film layer (24) of a constant thickness.

In the carbon nanotube solution (23), carbon nanotubes are dispersed in a dispersion solution. As a dispersion solution, sodium dodecyl benzene sulfonate (SDBS) solution may be used. The thickness of the carbon nanotube film layer (24) is controlled according to the amount of the carbon nanotube solution (23), the density of the carbon nanotubes in the carbon nanotube solution (23), and rotating speed of the turn table (41), etc.

Figure 8:
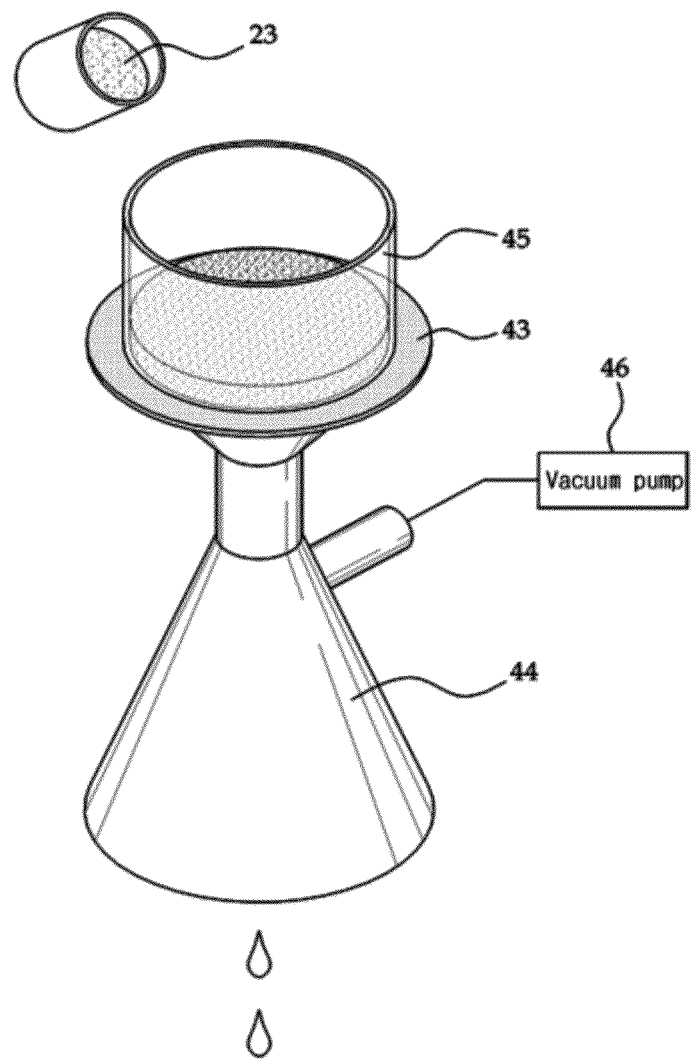
FIG. 8 and FIG. 9 illustrate the process to form the carbon nanotube film layer by a vacuum filtration method, in the process of manufacturing of a piezoresistive type touch panel according to an embodiment of the present invention.
Figure 9:
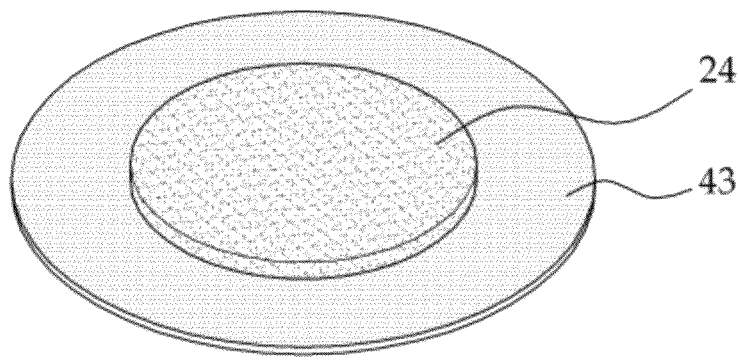

Meanwhile, FIG. 8 and FIG. 9 illustrate the process to form the carbon nanotube film layer (24) by the vacuum filtration method. First, as shown in FIG. 8, a filter (43) to filter out the carbon nanotube solution (23) is mounted on a suction member (44), and a frame (45) corresponding to the shape of the carbon nanotube film layer (24) is mounted over the filter (43). Then, as the carbon nanotube solution (23) is poured into the frame (45), a vacuum pump (46) connected to the suction member (44) is operated. At this time, the dispersion solution passes the filter (43) and is discharged to the bottom of the suction member (44), and the carbon nanotubes are collected on the filter (43).

The carbon nanotubes collected in this way is dried to form a carbon nanotube film layer (24) over the filter (43), as shown in FIG. 9. At this time, the thickness of the carbon nanotube film layer (24) varies depending on the amount of the carbon nanotube solution (23), the density of the carbon nanotubes in the carbon nanotube solution (23), and the porosity of the filter (43). Then, the carbon nanotube layer (24) collected on the filter (43) is transferred to the intermediate layer (22).

Figure 10:
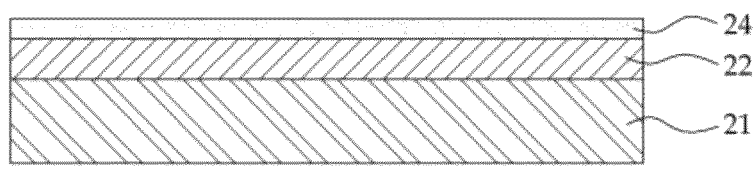
FIG. 10 illustrates a state in which a carbon nanotube film layer is formed on the intermediate layer, in the process of manufacturing of a piezoresistive type touch panel according to an embodiment of the present invention.

FIG. 10 shows that the carbon nanotube film layer (24) made from the spin coating method or the vacuum filtration method is transferred onto the intermediate layer (22). After the carbon nanotube film layer (24) is transferred onto the intermediate layer (22), the carbon nanotube film layer (24) is patterned through photolithography process to use the carbon nanotubes formed as a thin film over the intermediate layer (22) as a piezoresistive element.

Figure 11:
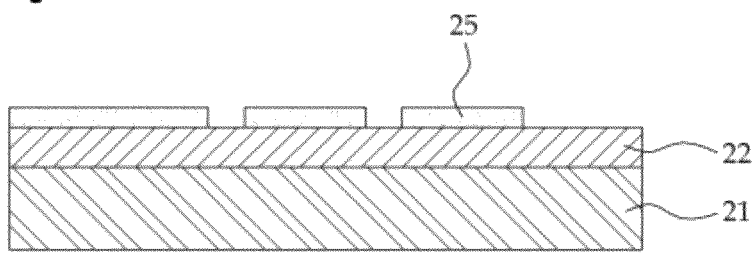
FIG. 11 illustrates a state in which a carbon nanotube film pattern (25) is formed over the intermediate layer by patterning the carbon nanotube film layer, in the process of manufacturing of a piezoresistive type touch panel according to an embodiment of the present invention.

The photolithography process used for patterning the carbon nanotube film layer (24) may use various dry or wet etchings to remove certain portions of the carbon nanotube film (24) with keeping the intermediate layer (22) remained. Since the photolithography process is a well known technique, the detailed explanation about the patterning process using the process is omitted. FIG. 11 illustrates the carbon nanotube film layer (24) is patterned through the photolithography process to form a carbon nanotube film pattern (25) over the intermediate layer (22).

Figure 12:
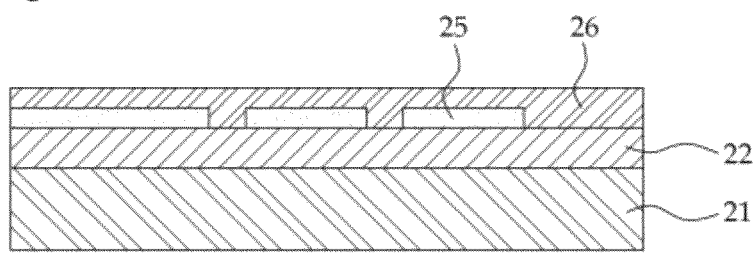
FIG. 12 illustrates a state in which a polymer membrane is formed on the intermediate layer, in the process of manufacturing of a piezoresistive type touch panel according to an embodiment of the present invention.

After the carbon nanotube film pattern (25) is formed on the intermediate layer (22), as shown in FIG. 12, liquid polymer solution is spin-coated over the intermediate layer (22) on which the carbon nanotube film pattern (24) is formed, and then is cured to manufacture a polymer membrane (26) in which the carbon nantotube film pattern (25) is embedded. At this time, commonly used various polymers which can be present as liquid phase, such as PDMS (poly-dimethylsiloxane), polyimide, UV curing polymer, and PMMA (polymethyl methacrylate), etc. may be used. After polymer is coated at an appropriate thickness, it may be cured in a convection oven to make a polymer membrane (26) which is chemically and thermally stable. The thickness of the polymer membrane (26) may be controlled according to the rotating speed and coating duration.

In the manufacturing of the polymer membrane (26), method in which polymer solution is applied over the intermediate layer (22) may employ various type of method to apply the polymer solution for an appropriate thickness, other than spin coating method.

Figure 13:
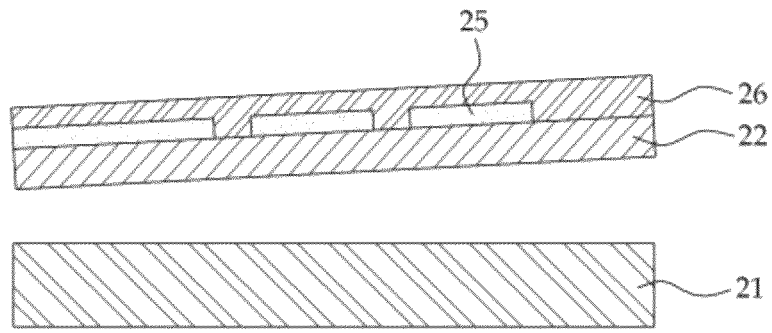
FIG. 13 illustrates the process to separate the intermediate layer from the substrate, in the process of manufacturing of a piezoresistive type touch panel according to an embodiment of the present invention.

After the polymer membrane (26) is manufactured, as shown in FIG. 13, the intermediate layer (22) is separated from the substrate (21). Since the bonding force between the intermediate layer (22) and the substrate (21) is weak, an application of physical force or separation solution which makes the bonding force weaker is used to easily separate the intermediate layer (22) from the substrate (21). Alternatively, the intermediate layer (22) may be etched to be separated from the substrate (21).

Figure 14:
FIG. 14 illustrates the process to separate the intermediate layer from the polymer membrane, in the process of manufacturing of a piezoresistive type touch panel according to an embodiment of the present invention.

Thereafter, as shown in FIG. 14, the intermediate layer (22) is separated from the polymer membrane (26). The intermediate layer (22) can be separated from the polymer membrane (26) by an application of physical force, and can be removed clearly from the polymer membrane (26) through etching process.

Figure 15:
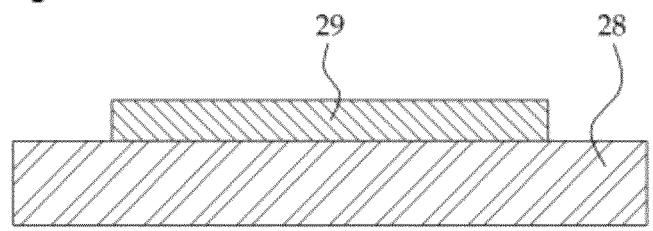
FIGS. 15 to 17 illustrates the process to manufacture a spacer, in the process of manufacturing of a piezoresistive type touch panel according to an embodiment of the present invention.
Figure 16:
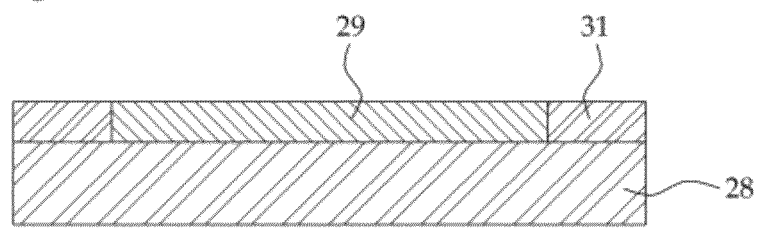
Figure 17:
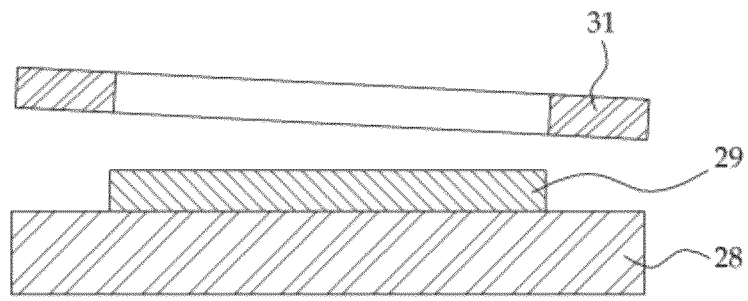

Next, with reference to FIGS. 15 to 17, the process to manufacture a spacer (31) for supporting the manufactured polymer membrane (26) is explained.

First, as shown in FIG. 15, a mold (19) which has a reversed shape of the spacer (31) is formed on a base (28). Here, photo resist (PR) may be used for the mold (19), and the mold (19) may be formed on the base (28) through photolithography process. In the present invention, the mold (29) may be formed on the base (28) with various materials other than photo resist and through any other methods than the photolithography process.

After the mold (29) is formed on the base (28), as shown in FIG. 16, a polymer solution is applied over the base (28) on which the mold (29) is formed, and then is cured. Thereafter, as shown in FIG. 17, the spacer (31) formed on the base (28) is separated from the base (28).

Figure 18:
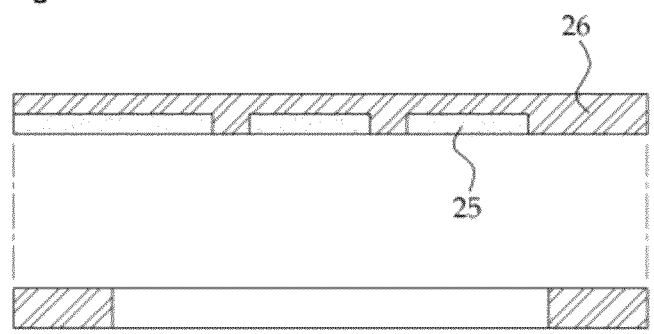
FIG. 18 illustrates the process to bond the spacer to the previously manufactured polymer membrane, in the process of manufacturing of a piezoresistive type touch panel according to an embodiment of the present invention.

Next, as shown in FIG. 18, the spacer (31) is bonded to the previously manufactured polymer membrane (26). This bond between the polymer membrane (26) and the spacer (31) may use various bonding methods including thermal bonding, and plasma surface treatment, etc.

Figure 19:
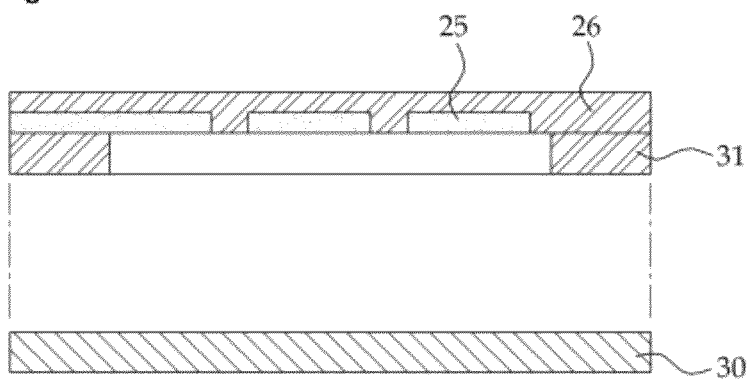
FIG. 19 illustrates the process to bond the assembly of the polymer membrane and the spacer to a bottom substrate, in the process of manufacturing of a piezoresistive type touch panel according to an embodiment of the present invention.

Finally, as shown in FIG. 19, the assembly of the polymer membrane (26) and the spacer (31) is bonded to a bottom substrate (30). According to the kinds of the bottom substrate (30), various bonding methods can be selected. When a transparent polymer membrane is used as the bottom substrate (30), methods such as thermal bonding and plasma surface treatment may be used.

As an alternative, the carbon nanotube film of the touch panel according to the present invention may be replaced with metal nanowire film. A nanowire is a nanostructure, with the diameter of the order of a nanometer ($10^{-9}$ meters). Alternatively, nanowires can be defined as structures that have a thickness or diameter constrained to tens of nanometers or less and an unconstrained length. Many different types of nanowires exist, including metallic (e.g., Ni, Pt, Au), semi-conducting (e.g., Si, InP, GaN, etc.), and insulating (e.g., SiO2, TiO2). Nanowires of many types of materials can be grown in solution.

Figure 20:
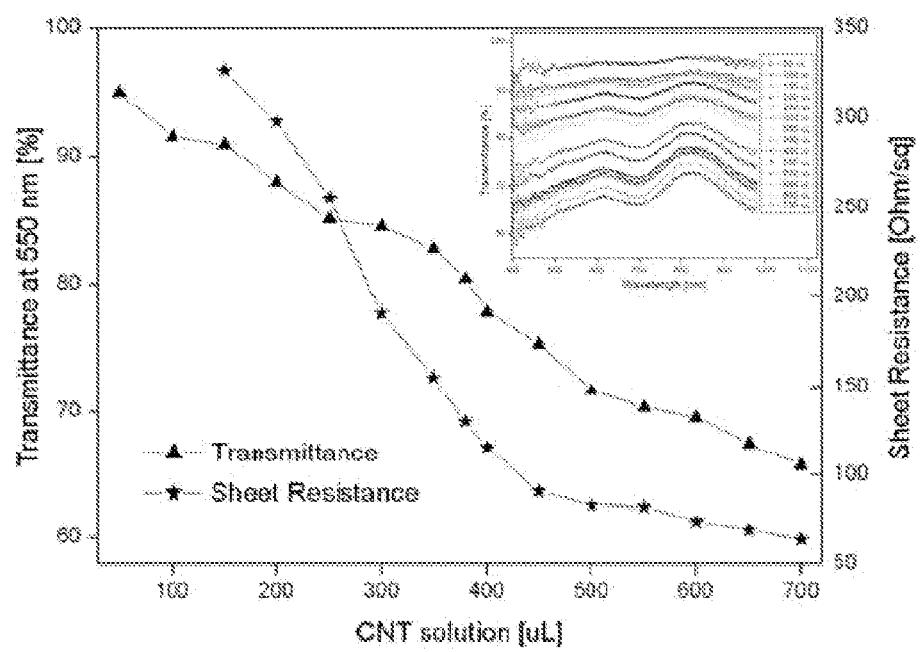
FIG. 20 illustrates transmittance of carbon nanotube films as piezoresistive transparent electrodes.

The property of carbon nanotube films (CNFs) as piezoresistive transparent electrodes is confirmed by performing experiments to measure the transmittance and sheet resistance. The transmittance can be controlled by changing the amounts of carbon nanotube (CNT) solutions in vacuum filtration. For these experiments, various CNT solutions between 50 μL and 700 μL are prepared. FIG. 20 shows the result of transmittance of 65 to 95% at 550 nm which is dominant wavelength in the human eyes, and sheet resistance in the range of 60 to 340 Ω/sq. This result of transmittance shows the range of visual and infrared wavelength. These values decrease as the amount of CNT solutions increases during vacuum filtration.

Figure 21:
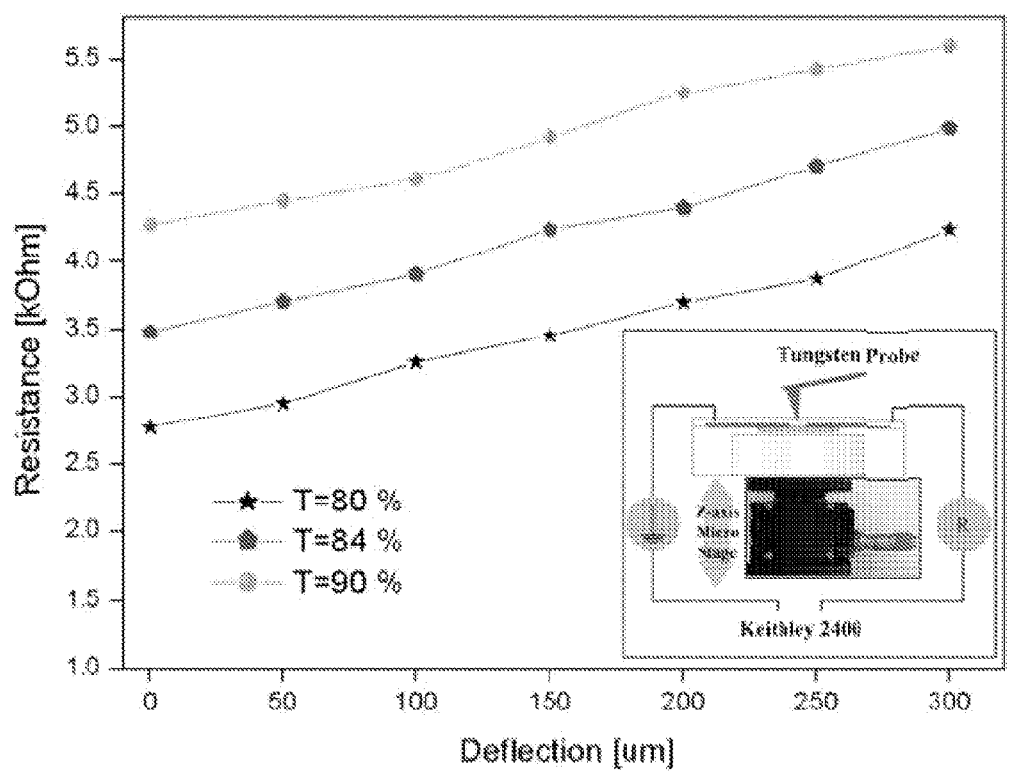
FIG. 21 illustrates resistance change of the carbon nanotube films as a function of membrane deflection.

As shown in FIG. 21, to obtain gauge factor, the resistance change is measured as a function of center deflection. The PDMS membrane is deflected with a tungsten probe tip and z-axis micro-stage in steps of 50 μm, and the resistance change of CNFs is obtained in the range of 10 to 20, which is 2 to 10 times higher than that of metal. Furthermore, CNF piezoresistors are fabricated with low-temperature process, so it is possible to use CNFs as piezoresistors in polymer MEMS.

When the touch panel according to the present invention is used for a display such as touch screen, an illuminator of LCD layer may be installed under the bottom substrate (30). When the touch panel is used for touch pad or touch sensor or pressure sensor, an opaque polymer membrane may be used as the polymer membrane (26) and the bottom substrate (30). The touch panel may be applied to many other areas, such as a game console having button(s) of the touch panel according to the present invention, and to a keyboard using the touch panel.

Touch sensor is an electronic device for measuring physical contact of an object at a defined small region and has been focused as data input device in transparent displays. The first touch sensor, which was developed by S. Hurst at the University of Kentucky in 1971, was not transparent like modern touch screens. However, it was a significant milestone in touch screen technology. The first true touch screen with a transparent surface was developed in 1974 and five-wire resistive technology was developed in 1977 which was the most popular touch screen technology in use today. The main attribute of touch sensor/screen is that it enables one to interact directly with a cursor rather than indirectly controlled by a mouse.

MEMS technologies have been used to fabricate touch sensors using piezoelectric polyvinylidene fluoride (PVDF) film, thin-film metal (NiCr) strain gauges, and conducting PDMS elastomers containing graphite particles.

Recently, touch sensors play a prominent role as data input devices in digital appliances such as personal digital assistant (PDA), satellite navigation devices, and mobile phones in transparent displays industry. Key technologies of touch sensors are the resistive and capacitive touch sensors. Resistive touch sensors are composed of two flexible layers coated with transparent ITO electrodes and separated by an air gap. This system can detect an input signal from any physical contact (such as finger or pen) when the top and bottom layers are directly connected. Advantages of this system are low cost and good accuracy, but the mechanical contact may cause crack in ITO electrodes. Capacitive touch sensors consist of an insulator such as glass, coated with ITO electrodes. Because the human body is a conductor, touching the surface of the screen results in a distortion of the body's electrostatic field. So, this system can detect when the capacitance is changed by the static electricity of human. However, this system only responds to conductive materials such as human finger. Furthermore, ITO may be exhausted within several decades, so alternative materials is needed for future transparent electrodes.

Figure 23A:
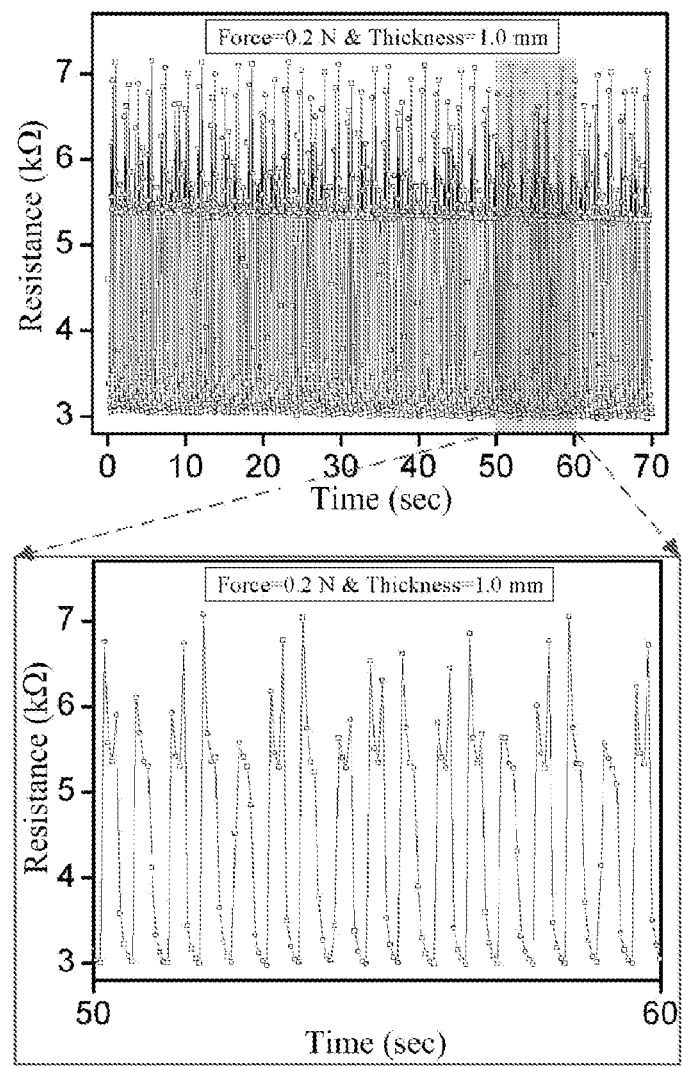
FIGS. 23a to 23c illustrate measurements of repeatability of SWCNF piezoresistors upon application of force of 0.2N at 1.7 Hz when varying the thickness of PDMS membrane.
Figure 23B:
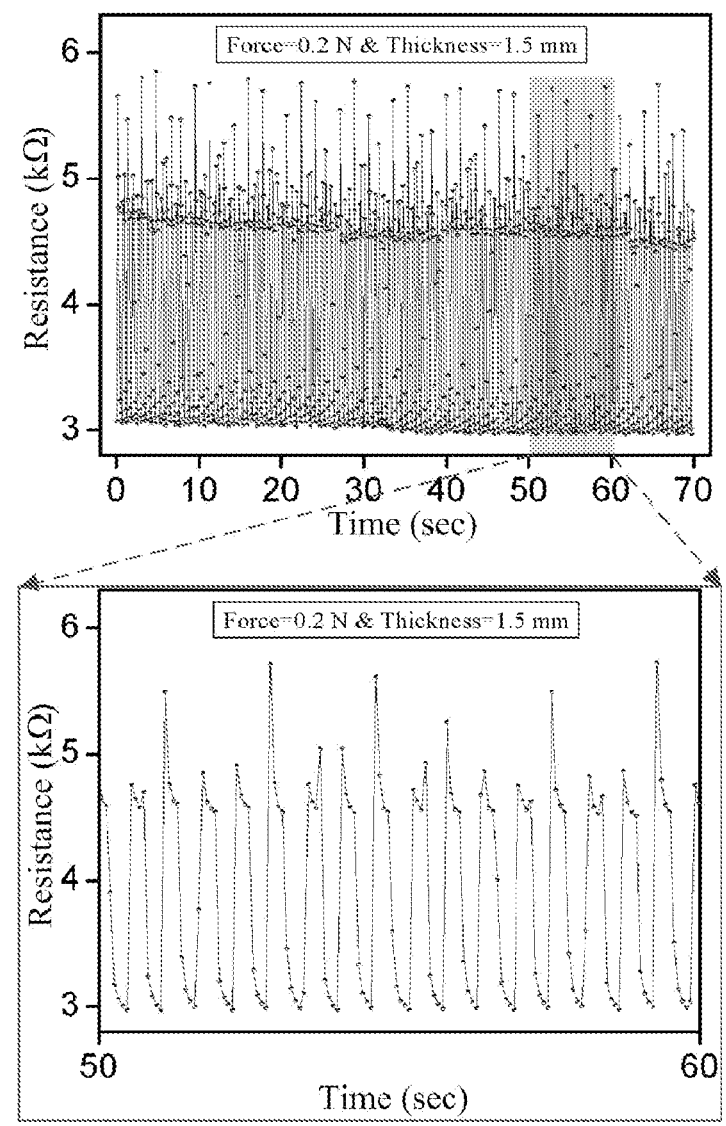
Figure 23C:
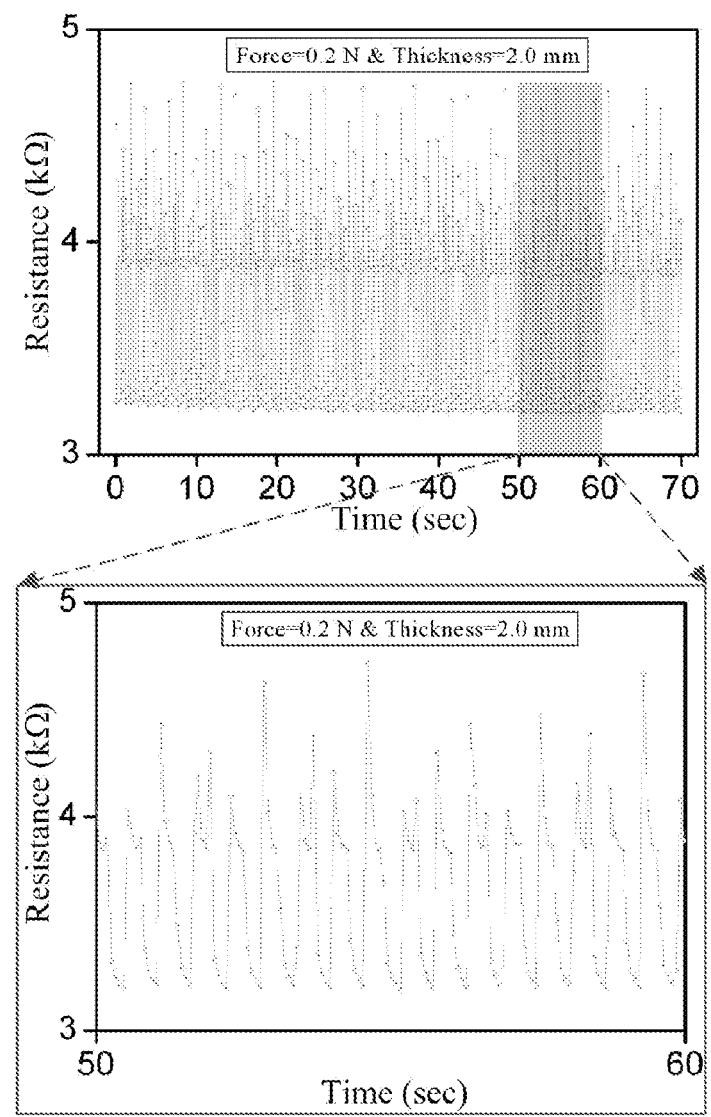

To confirm the repeatability of a touch sensor using the touch panel according to the present invention, experiment was performed by applying mechanical force on the center of PDMS membrane with a thickness of 1 mm using the indentation system at 0.1 Hz (period of 10 sec) during 70 sec. Experimental results show the increase of the resistance of single-walled carbon nanotube film (SWCNF) piezoresistors during a first half of a cycle and perfect recovery to the original state during the remained half of a cycle, as shown in FIG. 22a. This characteristic indicates a remarkable mechanical stability of SWCNF piezoresistors embedded in PDMS membrane. Input forces were divided into 5 levels from 0.2 N to 1.0 N and the changing resistance ranges from 3 kΩ to 12 kΩ. The FIG. 22a also shows that the resistance increases in proportion to the magnitude of the applied force. FIG. 22b shows the change in relative resistance which decreases in proportion to the thicknesses of PDMS membranes when the input force was 0.2 N, where R0 denotes the resistance when no external force is applied. In this experiment, the thicknesses of PDMS membranes were 0.5, 1.0, 1.5, and 2.0 mm, respectively. Because the stiffness is affected by the thickness of membrane, deflection of thinner membrane increases at the same force; therefore, the change in relative resistance is greater in a thinner membrane. FIGS. 23a to 23c show that the change in resistance is reproducible for more than a hundred cycles, when the 0.2 N input force was applied on PDMS membranes with the thicknesses of 1 mm, 1.5 mm, and 2.0 mm at 1.7 Hz (period of 0.6 sec) during 70 sec. In the same input mechanical force, the changing resistance ranges from 3 kΩ to 5.5 kΩ for the thickness of 1 mm; from 3 kΩ to 4.7 kΩ for the thickness of 1.5 mm; and from 3.2 kΩ to 3.8 kΩ for the thickness of 2.0 mm. Therefore, the signal above 5.5 kΩ, 4.7 kΩ, and 3.8 kΩ may be noise which can be filtered by using the low pass filter.

Figure 24:
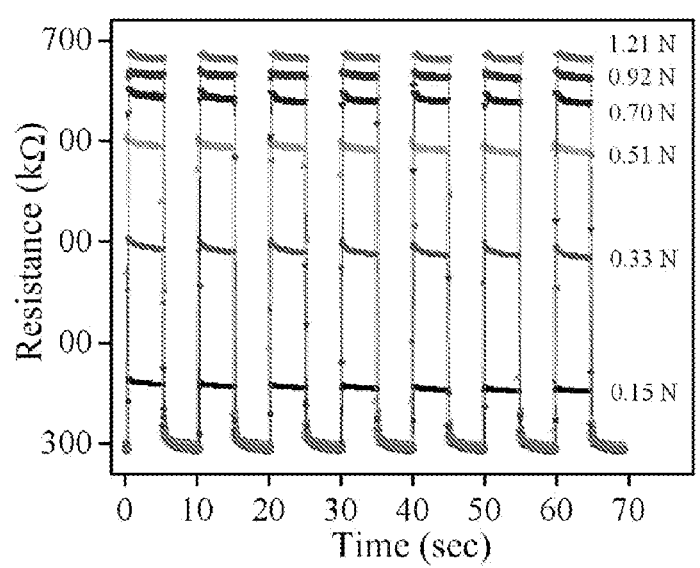
FIG. 24 illustrates experimental results of change in resistance of MWCNF piezoresistors using PDMS membrane with the thickness of 1 mm when varying the magnitude of the force applied at 0.1 Hz.

To compare the characteristic of transparent SWCNF piezoresistors with that of multi-walled carbon nanotube film (MWCNF) piezoresistors, it is measured the resistance change using MWCNF piezoresistors at the same conditions. The mechanical force was applied on the center of PDMS membrane with the thickness of 1 mm using the indentation system at 0.1 Hz during 70 sec. Experimental results show that the resistance of MWCNF piezoresistors increases during a first half of a cycle and is perfectly recovered to the original state during the remained half of a cycle as shown in FIG. 24. Input forces were divided into 6 levels from 0.15 N to 1.21 N and the changing resistance ranges from 290 kΩ to 690 kΩ. Therefore, it is demonstrated the resistance increases in proportion to the magnitude of the applied force.

Figure 25:
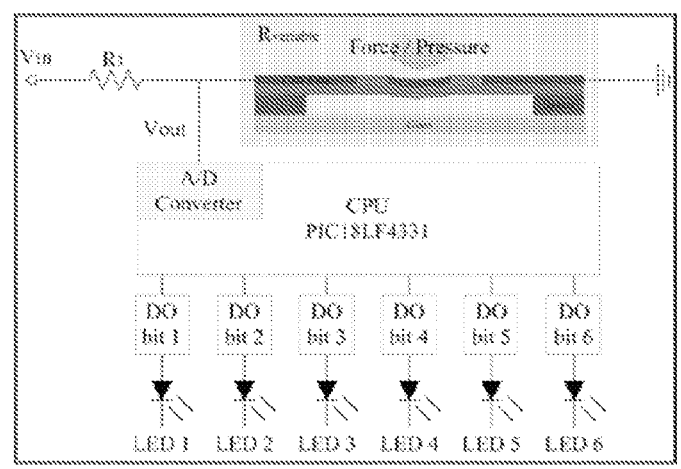
FIG. 25 illustrates a schematic view of circuits for piezoresistive touch display.

FIG. 25 shows a schematic view of circuits for a piezoresistive touch display using the touch panel according to the present invention. CNF piezoresistor can be operated as variable resistor (Rv) depending on the magnitude of the applied force. Using the voltage divider, output voltage (Vo) can be written as:

$$V_o = \frac{R_V}{R_1 + R_V} V_{in}$$

Figure 26:
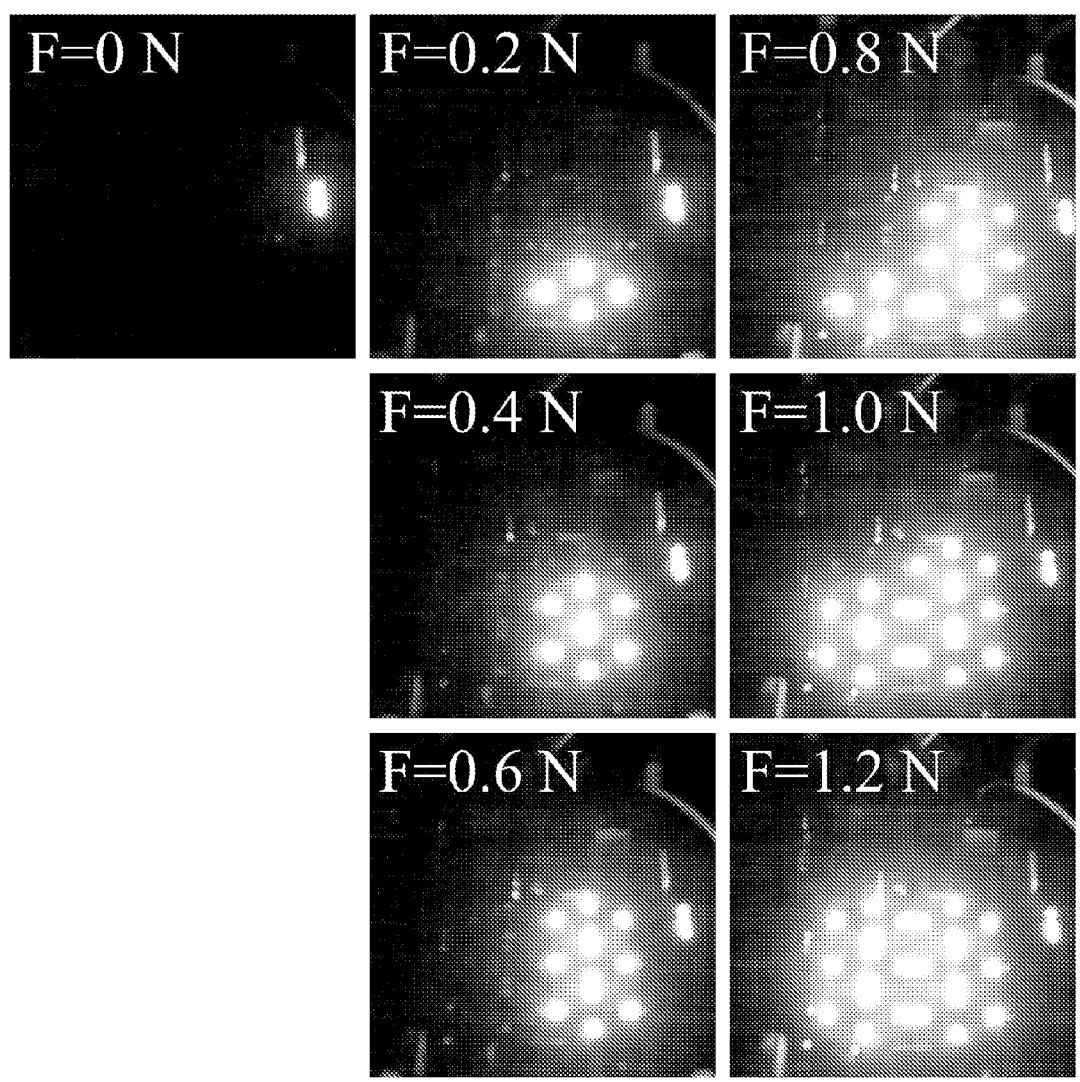
FIG. 26 illustrates experimental results of piezoresistive touch display.

The more stronger force is applied, the more resistance of CNF piezoresistors increases: thus, the output voltage increases depending on the variable resistance of the CNF piezoresistors. The output voltage can be converted to the discrete digital number proportional to the magnitude of the voltage using an analog-to-digital converter (ADC). As the magnitude of voltage output increases, LEDs turn on lights through CPU from LED 1 to LED 6 step by step. Without the input force, there is no LED light: that means '0' state. As shown in FIG. 26, as the strength of touch increases, the resistance of CNF piezoresistors increases, so LEDs turn on in sequence from 'LED 1' to 'LED 6'. Therefore, proposed piezoresistive touch display can be performed as multi-functional input devices.

The present invention as explained above does not limited to the illustrated and explained constructions and operations. That is, the present invention may be changed and modified within the idea and scope of claims.

What is claimed is:

1. A manufacturing method of a piezoresistive type touch panel comprising:
   manufacturing a polymer membrane in which a piezoresistive type film pattern, of which resistance varies with applied pressure, is embedded;
   manufacturing a spacer layer and attaching one side of the spacer layer to a surface of the polymer membrane; and
   attaching a bottom substrate to the other side of the spacer layer,
   wherein the step of manufacturing a polymer membrane comprises:
   (a) forming a intermediate layer on a substrate;
   (b) forming a carbon nanotube film layer or a metal nanowire film layer on the intermediate layer;
   (c) patterning the carbon nanotube film layer or the metal nanowire film layer to form a carbon nanotube film pattern or a metal nanowire film pattern on the intermediate layer;
   (d) applying a polymer solution over the intermediate layer on which the carbon nanotube film pattern or the metal nanowire film pattern is formed, and curing the applied polymer solution to form a polymer membrane including the carbon nanotube film pattern or the metal nanowire film pattern; and
   (e) separating the polymer membrane including the carbon nanotube film pattern or the metal nanowire film pattern from the intermediate layer.

2. The manufacturing method of a piezoresistive type touch panel according to claim 1, further comprising, after the step (d) is performed, separating the intermediate layer from the substrate, wherein the step (e) includes etching the intermediate layer to remove it, thereby separating the polymer membrane from the intermediate layer.

3. The manufacturing method of a piezoresistive type touch panel according to claim 1, wherein the step (b) includes applying a carbon nanotube solution or a metal nanowire solution, in which carbon nanotubes or metal nanowires are dispersed, over the intermediate layer as the substrate on which the intermediate layer is formed is rotated.

4. The manufacturing method of a piezoresistive type touch panel according to claim 1, wherein the step (b) includes, by using a filter and a vacuum pump, collecting carbon nanotubes or metal nanowires on the filter from a carbon nanotube solution or a metal nanowire solution in which carbon nanotubes or metal nanowires are dispersed, to form the carbon nanotube film layer or the metal nanowire film layer; and separating the carbon nanotube film layer or the metal nanowire film layer formed on the filter from the filter to transfer the carbon nanotube film layer or the metal nanowire film layer onto the intermediate layer.

5. The manufacturing method of a piezoresistive type touch panel according to claim 1, wherein the step (c) uses photolithography process.

6. The manufacturing method of a piezoresistive type touch panel according to one of claims 1 to 5, wherein the intermediate layer is a metal layer, and the step (a) is depositing the metal layer on the substrate.

7. The manufacturing method of a piezoresistive type touch panel according to claim 6, wherein the metal layer is gold (Au) layer.

8. The manufacturing method of a piezoresistive type touch panel according to claim 1, wherein the step of manufacturing a spacer layer and attaching one side of the spacer layer to a surface of the polymer membrane comprises:

(f) forming a mold on a base;

(g) applying a polymer solution over the base on which the mold is formed, and curing the applied polymer solution to form a spacer layer;

(h) separating the spacer layer from the mold and the base; and (i) attaching the separated spacer layer to the polymer membrane having a carbon nanotube film pattern or a metal nanowire film pattern.

9. The manufacturing method of a piezoresistive type touch panel according to claim 8, wherein the step (i) uses thermal bonding to attach the spacer layer to the polymer membrane having the carbon nanotube film pattern or the metal nanowire film pattern.

10. The manufacturing method of a piezoresistive type touch panel according to claim 8, wherein the mold is photo resist, and the step (f) includes using photolithography process to form the mold from photo resist.

\* \* \* \* \*